United States Patent
Blank et al.

(10) Patent No.: US 8,961,099 B2
(45) Date of Patent: Feb. 24, 2015

(54) DUAL ARM VACUUM ROBOT WITH COMMON DRIVE PULLEY

(71) Applicants: Richard M. Blank, San Jose, CA (US); Matthew J. McLellan, Fremont, CA (US)

(72) Inventors: Richard M. Blank, San Jose, CA (US); Matthew J. McLellan, Fremont, CA (US)

(73) Assignee: Novellus Systems, Inc., Fremont, CA (US)

( * ) Notice: Subject to any disclaimer, the term of this patent is extended or adjusted under 35 U.S.C. 154(b) by 227 days.

(21) Appl. No.: 13/739,744

(22) Filed: Jan. 11, 2013

(65) Prior Publication Data

US 2013/0183131 A1    Jul. 18, 2013

Related U.S. Application Data

(60) Provisional application No. 61/586,594, filed on Jan. 13, 2012, provisional application No. 61/611,883, filed on Mar. 16, 2012.

(51) Int. Cl.
*H01L 21/677* (2006.01)
*B25J 18/04* (2006.01)
*B25J 9/04* (2006.01)

(52) U.S. Cl.
CPC ........... *B25J 18/04* (2013.01); *H01L 21/67739* (2013.01); *H01L 21/67742* (2013.01); *B25J 9/043* (2013.01); *Y10S 901/19* (2013.01)
USPC ........................................ 414/744.5; 901/19

(58) Field of Classification Search
CPC .................. H01L 21/67706; H01L 21/67742; H01L 21/68707; B25J 9/042; B25J 18/04
USPC .................................... 414/744.5; 901/19, 23
See application file for complete search history.

(56) References Cited

U.S. PATENT DOCUMENTS

| | | | |
|---|---|---|---|
| 7,891,935 B2 | 2/2011 | Kremerman | |
| 8,376,685 B2* | 2/2013 | Pietrantonio et al. | 414/744.5 |
| 2012/0045308 A1* | 2/2012 | Kremerman | 414/744.5 |
| 2012/0141235 A1* | 6/2012 | Krupyshev et al. | 414/744.5 |
| 2012/0189419 A1* | 7/2012 | Yazawa et al. | 414/744.2 |
| 2012/0232690 A1* | 9/2012 | Gilchrist et al. | 901/15 |
| 2014/0154033 A1* | 6/2014 | Blank et al. | 414/217 |

FOREIGN PATENT DOCUMENTS

JP        2011045945 A    *    3/2011

* cited by examiner

*Primary Examiner* — Gerald McClain
(74) *Attorney, Agent, or Firm* — Weaver Austin Villeneuve & Sampson LLP

(57) ABSTRACT

A robot for use in semiconductor vacuum chambers is disclosed. The robot may include two independently-driven arms configured for wafer handling. The robot may include three motors or drive systems and a tri-axial seal to realize independent extension/retraction of each arm and overall simultaneous rotation of the arm assembly. The robot may provide enhanced throughput efficiency over other robot designs.

15 Claims, 14 Drawing Sheets

| A Motor | B Motor | Common Motor |
|---------|---------|--------------|
| 32° | 32° | 32° |

# DUAL ARM VACUUM ROBOT WITH COMMON DRIVE PULLEY

This application claims benefit under 35 U.S.C. §119(e) to U.S. Provisional Application No. 61/586,594, filed Jan. 13, 2012, and to U.S. Provisional Application No. 61/611,883, filed Mar. 16, 2012, both of which are titled "DUAL ARM VACUUM ROBOT" and both of which are incorporated by reference herein in their entireties.

BACKGROUND

Different types of tools are used to perform hundreds of processing operations during semiconductor device fabrication. Most of these operations are performed in process chambers at very low pressure, i.e., in a vacuum or partial vacuum. Such process chambers may be arranged about a central hub, and the hub and process chambers may be kept at substantially the same very low pressure. Wafers may be introduced to the process chambers by wafer handling systems that are mechanically coupled to the process chambers and/or central hub. The wafer handling systems transfer wafers from the factory floor to the process chamber. The wafer handling systems may include loadlocks to bring the wafers from atmospheric conditions to very low pressure conditions and back, and robots to transfer the wafers to various positions. Wafer handling systems may utilize robots that operate outside of the vacuum environment, e.g., robots that operate in the ambient factory floor environment, and robots that operate within the very low pressure environment of the process chambers. Throughput—the number of wafers that is processed in a period of time—is affected by the process time, the number of wafers that are processed at a time, as well as timing of the steps to introduce the wafers into the vacuum process chambers.

SUMMARY

In some implementations, a wafer-transport robot for use in semiconductor fabrication apparatus vacuum chambers may be provided. The robot may include a first arm, the first arm including a first end effector interface at one end, a second arm, the second arm including a second end effector interface at one end, and a base. The base may include a first motor, a second motor, and a third motor. The base may have a central axis. Activation of the first motor without activation of the second motor or the third motor may cause the first arm to translate the first end effector interface in a direction perpendicular to the central axis without rotation of the first end effector interface about the central axis. Activation of the second motor without activation of the first motor or the third motor may cause the second arm to translate the second end effector interface in a direction perpendicular to the central axis without rotation of the second end effector interface about the central axis. Activation of the first motor, the second motor, and the third motor simultaneously may cause the first end effector interface and the second end effector interface to rotate about the central axis without translation of the first end effector interface and the second end effector interface in directions perpendicular to the central axis.

In some further implementations of the robot, activation of the first motor without activation of the second motor or the third motor may not cause the second arm to move, and activation of the second motor without activation of the first motor or the third motor may not cause the first arm to move.

In some further implementations of the robot, the first arm may include a first mechanical input including a first primary rotational input and a first secondary rotational input. The first primary rotational input and the first secondary rotational input may both be configured to rotate substantially about the central axis. Rotation of the first primary rotational input relative to the first secondary rotational input in a first rotational direction may cause the first end effector interface to translate in a first direction perpendicular to the central axis, and rotation of the first primary rotational input and the first secondary rotational input both in the same rotational direction may cause the first end effector interface to rotate about the central axis without translating in a direction perpendicular to the central axis. The second arm may include a second mechanical input including a second primary rotational input and a second secondary rotational input. The second primary rotational input and the second secondary rotational input may both be configured to rotate substantially about the central axis. Rotation of the second primary rotational input relative to the second secondary rotational input in a second rotational direction may cause the second end effector interface to translate in a second direction perpendicular to the central axis, and rotation of the second primary rotational input and the second secondary rotational input both in the same rotational direction may cause the second end effector interface to rotate about the central axis without translating in a direction perpendicular to the central axis.

In some such implementations of the robot, the first secondary rotational input and the second secondary rotational input may be rotationally coupled and may not rotate independently.

In some implementations of the robot, the first primary rotational input may be rotationally coupled with the first motor, the second primary rotational input may be rotationally coupled with the second motor, and the first secondary rotational input and the second secondary rotational input may both be rotationally coupled with the third motor.

In some implementations of the robot, the base may further include a fourth motor, the fourth motor configured to translate the first arm and the second arm in a direction parallel to the central axis.

In some implementations of the robot, the first arm may include a first upper arm with a proximal end and a distal end opposite the proximal end of the first upper arm and a first lower arm with a proximal end and a distal end opposite the proximal end of the first lower arm. Similarly, the second arm may include a second upper arm with a proximal end and a distal end opposite the proximal end of the second upper arm and a second lower arm with a proximal end and a distal end opposite the proximal end of the second lower arm. The proximal ends of the first upper arm and the second upper arm may both be configured to rotate substantially about the central axis, the proximal end of the first lower arm may be rotatably connected with the distal end of the first upper arm, the proximal end of the second lower arm may be rotatably connected with the distal end of the second upper arm, the first end effector interface may be rotatably connected with the distal end of the first lower arm, and the second end effector interface may be rotatably connected with the distal end of the second lower arm.

In some implementations of the robot, the robot may also include a first lower arm driven pulley fixedly connected with the proximal end of the first lower arm, a second lower arm driven pulley fixedly connected with the proximal end of the second lower arm, a common drive pulley, a first upper arm drive belt rotationally coupling the first lower arm driven pulley with the common drive pulley, and a second upper arm drive belt rotationally coupling the second lower arm driven pulley with the common drive pulley.

In some implementations, the robot may further include a first upper arm drive pulley fixedly connected with the first upper arm, a second upper arm drive pulley fixedly connected with the second upper arm, a first end effector driven pulley fixedly connected with the first end effector interface, a second end effector driven pulley fixedly connected with the second end effector interface, a first lower arm drive belt rotationally coupling the first end effector driven pulley with the first upper arm drive pulley, and a second lower arm drive belt rotationally coupling the second end effector driven pulley with the second upper arm drive pulley.

In some further implementations of the robot, the robot may further include a controller including one or more processors and one or more memories and configured to control the first motor, the second motor, and the third motor. The one or more memories may store computer-executable instructions for controlling the one or more processors to activate the first motor without activating the second motor or the third motor to cause the first arm to extend the first end effector interface in a first radial direction perpendicular to the central axis without causing rotation of the first end effector interface about the central axis, activate the second motor without activating the first motor or the third motor to cause the second arm to extend the second end effector interface in a second radial direction perpendicular to the central axis without causing rotation of the second end effector interface about the central axis, and activate the first motor, the second motor, and the third motor simultaneously to cause the first end effector interface and the second end effector interface to rotate about the central axis without causing translation of the first end effector interface and the second end effector interface in directions perpendicular to the central axis.

In some further implementations of the robot, the first end effector interface and the second end effector interface may be oriented in opposing directions, and the computer executable instructions for controlling the one or more processors include instructions for controlling the one or more processors to activate the first motor without activating the second motor or the third motor by causing the first motor to provide a rotational output in a first rotational direction about a first axis substantially parallel to the central axis, activate the second motor without activating the first motor or the third motor by causing the second motor to provide a rotational output in the first rotational direction about a second axis substantially parallel to the central axis, and activate the first motor, the second motor, and the third motor by causing the first motor, the second motor and the third motor to rotate in the same rotational direction simultaneously to cause the first end effector interface and the second end effector interface to rotate about the central axis without causing translation of the first end effector interface and the second end effector interface in directions perpendicular to the central axis.

In some such further implementations of the robot, the first end effector interface and the second end effector interface may be substantially co-planar with one another.

In some other further implementations of the robot, the first end effector interface and the second end effector interface are oriented in the same direction, and the computer executable instructions for controlling the one or more processors include instructions for controlling the one or more processors to activate the first motor without activating the second motor or the third motor to extend the first arm by causing the first motor to provide a rotational output in a first rotational direction about a first axis substantially parallel to the central axis, activate the second motor without activating the first motor or the third motor to extend the second arm by causing the second motor to provide a rotational output in a second rotational direction about a second axis substantially parallel to the central axis, the second rotational direction opposite the first rotational direction, and activate the first motor, the second motor, and the third motor by causing the first motor, the second motor and the third motor to rotate in the same rotational direction simultaneously to cause the first end effector interface and the second end effector interface to rotate about the central axis without causing translation of the first end effector interface and the second end effector interface in directions perpendicular to the central axis.

In some such further implementations of the robot, the first end effector interface and the second end effector interface may be located on spaced-apart parallel planes and are configured to have substantially the same range of radial motion.

In some implementations of the robot, the robot may further include a first end effector and a second end effector. The first end effector may be affixed to the first end effector interface, and the second end effector may be affixed to the second end effector interface.

In some implementations of the robot, the first motor, the second motor, and the third motor may each have an axis of rotation and the axes of rotation of the first motor, the second motor, and the third motor may be substantially coaxial with the central axis. In some other implementations of the robot, the first motor, the second motor, and the third motor may each have an axis of rotation and at least one of the axes of rotation of the first motor, the second motor, and the third motor may be offset from the central axis.

In some further implementations of the robot, the common drive pulley may have a common drive pulley diameter, the first lower arm driven pulley and the second lower arm driven pulley may both have a lower arm driven pulley diameter, and the common drive pulley diameter and the lower arm driven pulley diameter may have a ratio to one another of 2:1, respectively.

In some further implementations of the robot, the first upper arm drive pulley and the second upper arm drive pulley may both have an upper arm drive pulley diameter, the first end effector driven pulley and the second end effector driven pulley may both have an end effector driven pulley diameter, and the upper arm drive pulley diameter and the end effector driven pulley diameter may have a ratio to one another of 1:2, respectively.

In some implementations, a wafer-transport robot for use in semiconductor fabrication apparatus vacuum chambers may be provided. The robot may include a first arm with a first end effector interface, a second arm with a second end effector interface, and a base. The first arm and the second arm may each be rotatable with respect to the base about a common axis. The first arm may be configured to translate the first end effector interface in a first direction perpendicular to the common axis without translating or rotating the second end effector interface, the second arm may be configured to translate the second end effector interface in a second direction perpendicular to the common axis without translating or rotating the first end effector interface, and the first arm and the second arm may be configured to rotate the first end effector interface and the second end effector interface about the common axis simultaneously without translating the first end effector interface and the second end effector interface in the first direction and the second direction, respectively.

DRAWINGS

DETAILED DESCRIPTION

Examples of various embodiments are illustrated in the accompanying drawings and described further below. It will be understood that the discussion herein is not intended to limit the claims to the specific embodiments described. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations have not been described in detail in order not to unnecessarily obscure the present invention.

Figure 1A:
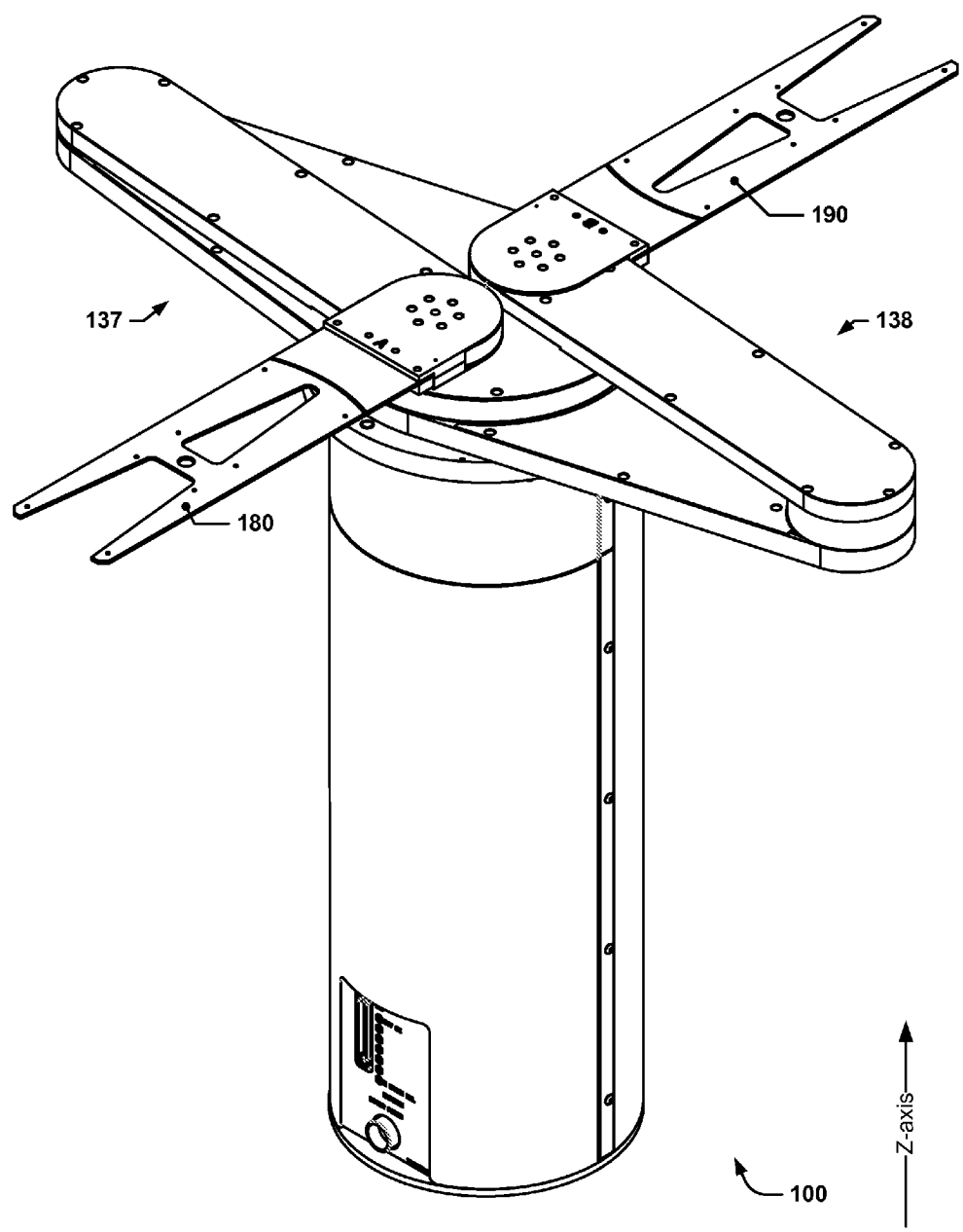
FIG. 1A depicts an isometric view of an example of one implementation of a robot according to the present disclosure.
Figure 1B:
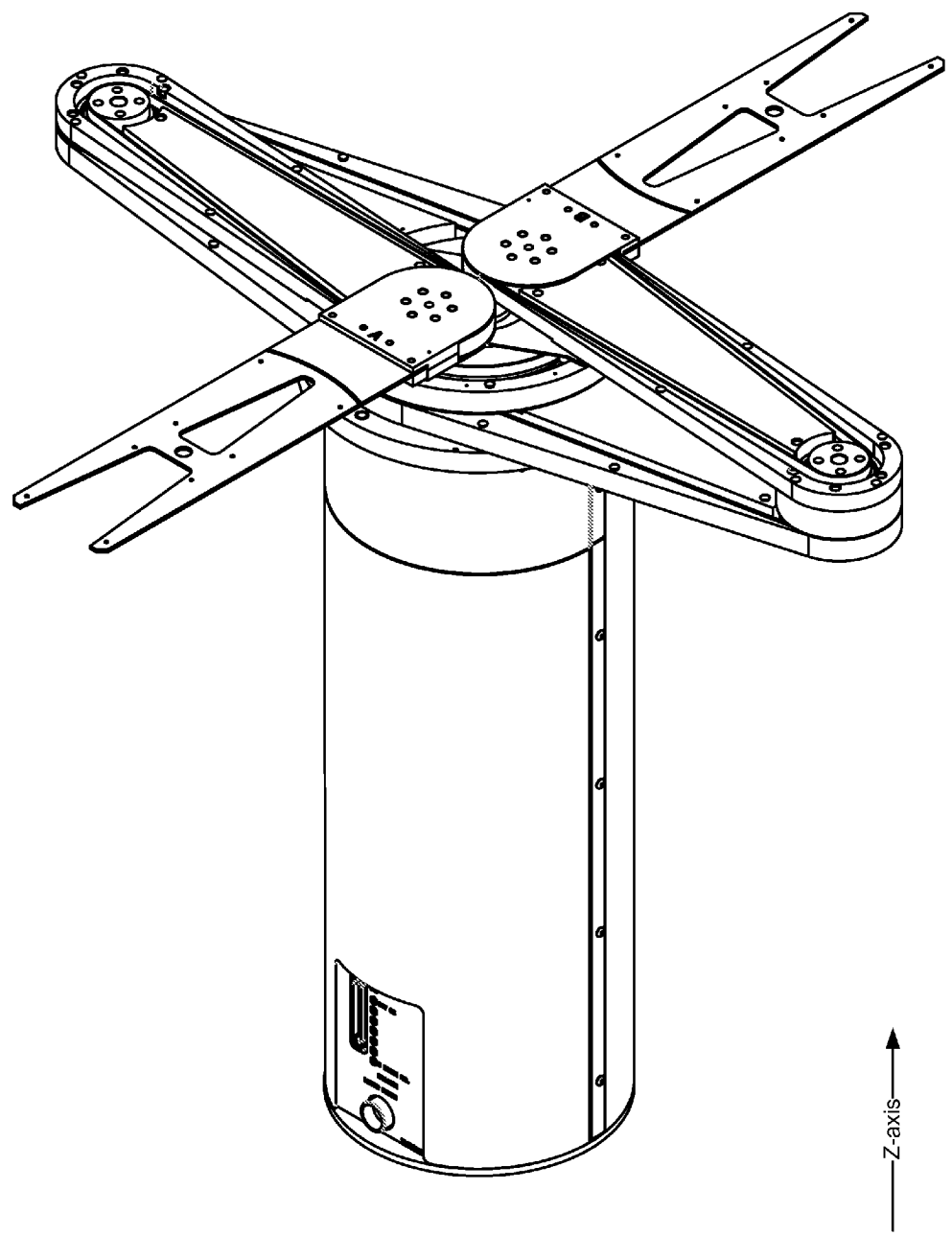
FIG. 1B depicts an isometric view of the robot of FIG. 1A, but with various cover plates removed to show internal mechanisms.

FIG. 1A shows an isometric view of a robot 100 for use in very low pressure environments such as semiconductor fabrication process chamber environments. The robot 100 features an A arm 137 and a B arm 138. The A arm 137 and the B arm 138 may each be configured with end effector A 180 and end effector B 190, respectively, suitable for lifting and transporting semiconductor wafers from station to station. In some implementations, the end effector A 180 and the end effector B 190 may be removably connected to end effector interfaces that are part of the A arm 137 and the B arm 138, respectively. The A arm 137 and the B arm 138 face in opposing directions in robot 100, although other configurations of arms may be used as well. For example, A arm 137 and B arm 138 may face in the same direction and be stacked on top of each other. FIG. 1B shows the robot 100 shown in FIG. 1A, but with various cover panels on portions of the A arm 137 and the B arm 138 removed to allow some of the inner workings of the arms to be seen.

Figure 1C:
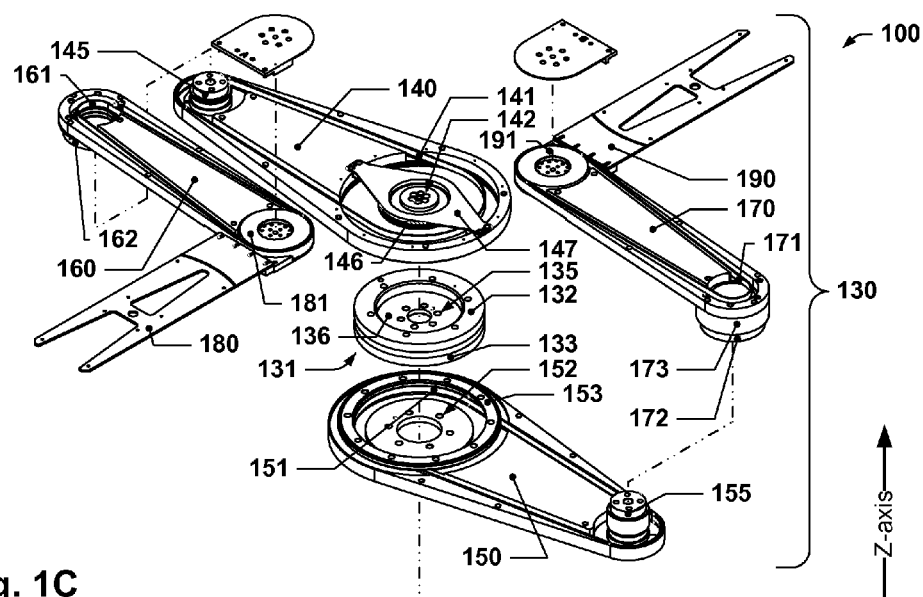
FIG. 1C depicts an isometric exploded view of the robot of FIG. 1B and shows two alternate drive configurations.
Figure 1C:
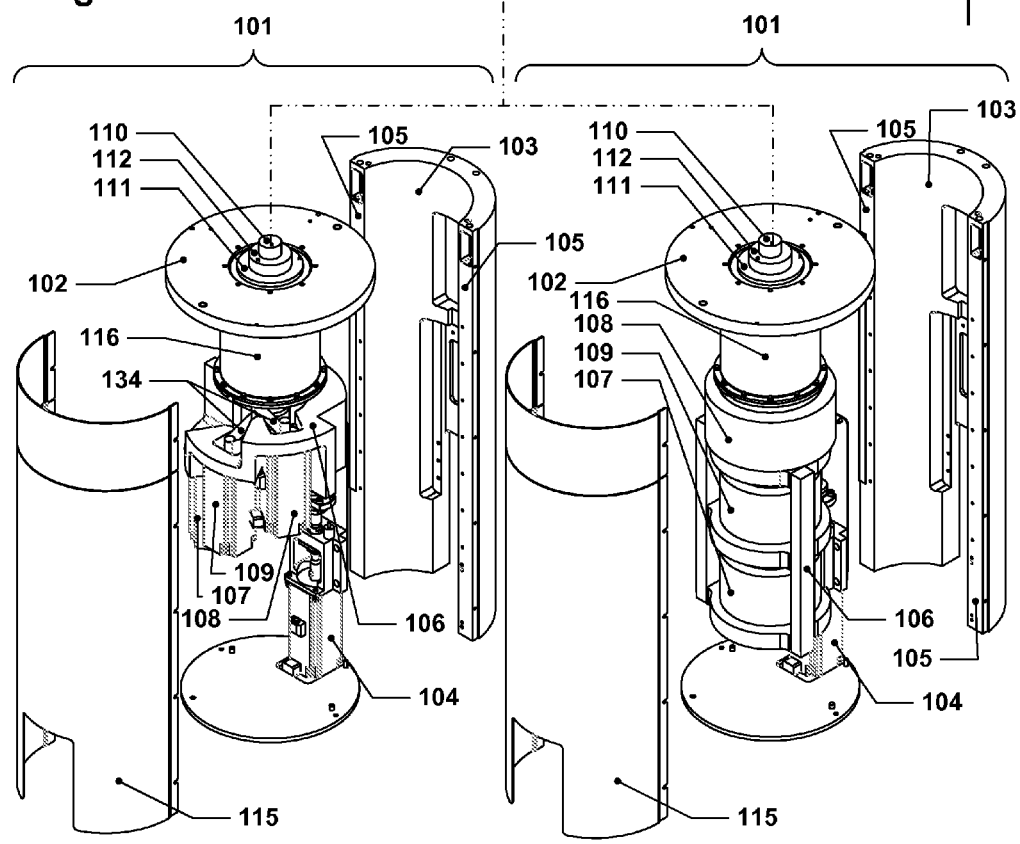

FIG. 1C shows an isometric exploded view of the robot 100. Some of the structures shown in FIG. 1C may be shown in simplified form to avoid visual clutter that is not needed to understand the concepts disclosed herein. As with FIG. 1B, various cover panels have been omitted to allow for clearer viewing of other parts. The robot 100 may include a base 101, sometimes referred to as a base unit, and an arm assembly 130. Two alternate implementations of a base unit 101 are shown, although both may include a base plate 102 that may be used to mount the robot 100 within a semiconductor process chamber, central hub, or tool. A support structure 103 may be rigidly connected with the base plate 102 and may be used to provide support to the arm assembly 130, as well as other components within the base 101.

The support structure 103 may, for example, be rigidly connected with rails (not shown) along face 105, that may allow for z-axis, e.g., vertical, movement of a motor support 106. The motor support 106 may include glides or other hardware that may be slidably engaged with the rails and that may prevent the motor support 106 from moving in directions other than along the z-axis. The motor support 106 may be moved in the z-axis direction by a z-axis drive 104. The z-axis drive 104 may be, for example, a linear drive assembly using a lead screw driven by a rotational motor.

The motor support 106 may support an A drive motor 107, a B drive motor 108, and a common drive motor 109. The A drive motor 107, the B drive motor 108, and the common drive motor 109 may be similar motors, or may be different motors. For example, the B drive motor 108 may be a stepper motor that can supply 10 N-m of continuous torque and 30 N-m peak torque. The A drive motor 107 and common drive motor 109 may both, for example, be capable of supplying 5 N-m of continuous torque and 15 N-m of peak torque. In some implementations, motors with torque capabilities of approximately 50% of those discussed in the above example may be used, although such implementations may not be capable of supporting as many different sizes or types of arms as the example motor set may support.

The base unit 101 may also include an A drive shaft 110, a B drive shaft 111, and a common drive shaft 112. The A drive shaft 110 may be rotationally driven by the A drive motor 107. The B drive shaft 111 may be rotationally driven by the B drive motor 108. The common drive shaft 112 may be rotationally driven by the common drive motor 109. The A drive shaft 110, the B drive shaft 111, and the common drive shaft 112 may be coaxially arranged and may all rotate about substantially the same axis. The A drive shaft 110, the B drive shaft 111, and the common drive shaft 112 may all pass through a tri-axial ferro-fluidic seal 116, such as those supplied by Ferrotec Corp., and an accompanying bellows coupling. The tri-axial ferro-fluidic seal 116 may allow for three independently driven shafts to be passed through the seal without loss of seal integrity ("tri-axial" does not refer to three orthogonal axes in this case, but to three coaxial axes). This allows the majority of the base 101 to be operated in an environment different from the very low pressure environments observed in the hub or the semiconductor process chambers and within which the arm assembly 130 will function. A base cover 115 may be attached to the base 101 to prevent damage to the internal components of the base 101. While a ferro-fluidic seal is used in this implementation, other types of seals may be used in place of, or in addition to, a ferro-fluidic seal, such as magnetic couplings or friction seals.

As noted above, two alternative base unit arrangements are shown in FIG. 1C. The right-hand base unit 101 depicts a drive system where the A drive motor 107, the B drive motor 108, the common drive motor 109, the A drive shaft 110, the B drive shaft 111, and the common drive shaft 112 are all coaxial with each other. In such an arrangement, the drive shafts may each be directly coupled to their respective drive motors.

The left-hand base unit 101 depicts a drive system where the A drive motor 107, the B drive motor 108, and the common drive motor 109 are not coaxial with each other, the A drive shaft 110, the B drive shaft 111, or the common drive shaft. In such an arrangement, the drive motors may be coupled to their respective drive shafts via belts, such as belts 134.

The arm assembly 130 may include an A arm 137 and a B arm 138. The A arm 137 and the B arm 138 may operate in a similar manner and utilize many common components, although the two arms may differ slightly in construction to allow for operating clearances and particular arm assembly configurations.

The A arm 137 may include an upper A arm 140 and a lower A arm 160 with and an end effector A 180 attached (or attachable) thereto. The B arm 138 may include an upper B arm 150 and a lower B arm 170 with an end effector B 190 attached (or attachable) thereto. The end effector A 180 and the end effector B 190 can be any type of end effectors including paddles, forks, grippers, and the like. In some implementations, the robot 100 may be provided to a customer without end effectors, but with end effector interfaces that can accept one or more types of end effectors, thereby allowing the customer to customize the robot for a particular application or process.

One end of the upper A arm 140 may be rigidly coupled with the A drive shaft 110 such that when the A drive shaft 110 is rotated by the A drive motor 107, the upper A arm 140 rotates with respect to the base 101 about the rotational axis of the A drive shaft 110. For example, a plate with an A drive shaft hole pattern 142 may be bolted to the A drive shaft 110 and joined via an upper A arm bellows coupling 146 to a load transfer plate 147 that is bolted to the upper A arm 140 that allows for a substantially rigid rotational coupling between the A drive shaft 110 and the upper A arm 140 while still allowing for minor axial misalignments during assembly. The other end of the upper A arm 140 may be rotationally coupled with one end of the lower A arm 160. The other end of the lower A arm 160 may, in turn, be rotationally coupled with the end effector A 180.

Similarly, one end of the upper B arm 150 may be rigidly coupled with the B drive shaft 111 such that when the B drive shaft 111 is rotated by the B drive motor 108, the upper B arm 150 rotates with respect to the base 101 about the rotational axis of the B drive shaft 111. For example, the upper B arm 150 may be bolted to the B drive shaft via B drive shaft hole pattern 152. The other end of the upper B arm 150 may be rotationally coupled with one end of the lower B arm 170. The other end of the lower B arm 170 may, in turn, be rotationally coupled with the end effector B 190.

The upper A arm 140 and the upper B arm 150 may also be rotationally coupled with each other via an upper arm bearing 153. The rotational axis of the upper arm bearing 153 may be substantially coaxial with the rotational axes of the A drive shaft 110 and the B drive shaft 111.

The upper A arm 140 and the upper B arm 150 may both rotate about a common drive pulley assembly 131, that may be housed between a first recess in the upper A arm 140 and a similar first recess in the upper B arm 150. The common drive pulley assembly 131 may rotate about an axis substantially coaxial with the rotational axes of the A drive shaft and the B drive shaft with respect to the upper A arm 140 and the upper B arm 150. The common drive pulley assembly may include a common drive plate 136 with a common drive shaft hole pattern 135. The common drive shaft hole pattern 135 may be configured to allow the common drive plate 136 to be rigidly connected with the common drive shaft 112 such that rotation of the common drive shaft 112 causes the common drive pulley assembly 131 to rotate about the rotational axis of the common drive shaft 112.

The common drive pulley assembly 131 may also include a common drive pulley A 132 and a common drive pulley B 133, which may be rigidly connected with the common drive plate 136.

The lower A arm 160 may include a lower A arm driven pulley 162, that, when the lower A arm 160 is rotatably connected with the upper A arm 140, may protrude into a second recess in the upper A arm 140. The lower A arm driven pulley 162 may be rigidly connected with the lower A arm 160. The diameter of the lower A arm driven pulley 162 may be one half the diameter of the common drive pulley A 132. An upper A arm drive belt 141 may be stretched over both the lower A arm driven pulley 162 and the common drive pulley A 132. The upper A arm drive belt 141 may be made from steel or some other material with a relatively high tensile elasticity, such as 301 high-yield stainless steel. Various belt tensioning systems may be employed to help eliminate rotational slop between the common drive pulley A 132 and the lower A arm driven pulley 162. A pair of channels connecting the first recess and the second recess of the upper A arm 140 may allow the upper A arm drive belt 141 to span between the common drive pulley A 132 and the lower A arm driven pulley 162.

When the upper A arm 140 is rotated through an angle X with respect to the common drive pulley assembly 131 and, consequently, the common drive pulley A 132, this causes the upper A arm drive belt to circulate within the first recess and the second recess of the upper A arm 140, as well as within the channels connecting those recesses, and also causes the lower A arm driven pulley 162 to be rotated with respect to the upper A arm 140. Due to the 2:1 diameter ratio between the common drive pulley A 132 and the lower A arm driven pulley 162 in this example, the lower A arm driven pulley 162, as well as the lower A arm 160 rigidly connected with the lower A arm driven pulley 162, may be rotated through an angle of 2X and in the opposite direction of the rotation of the upper A arm 140 by the movement of the upper A arm drive belt 141.

The end effector A 180, as mentioned above, may be rotationally coupled with the end of the lower A arm 160 opposite the end of the lower A arm 160 featuring the lower A arm driven pulley 162. The end effector A 180 may include an end effector A driven pulley 181 that is rigidly connected with the end effector A 180, i.e., rotation of the end effector A driven pulley 181 with respect to the lower A arm 160 causes the end effector A 180 to rotate with respect to the lower A arm 160 as well. A lower A arm drive belt 161 may be stretched over the end effector A driven pulley 181 and an upper A arm drive pulley 145. The upper A arm drive pulley 145 may be rigidly connected with the upper A arm 140, and may be approximately one half the diameter of the end effector A driven pulley 181. The lower A arm drive belt 161 may be made from material similar to that used for the upper A arm drive belt 141.

When the lower A arm 160 is rotated through an angle Y with respect to the upper A arm 140, which consequently causes the upper A arm drive pulley 145 to rotate with respect to the lower A arm 160, this causes the lower A arm drive belt 161 to circulate within the lower A arm 160 and also causes the end effector A driven pulley 181 to be rotated with respect to the lower A arm 160 through, in this example, an angle of ½Y and in the opposite direction of the rotation of the lower A arm 160.

Because the end effector A 180, the lower A arm 160, and the upper A arm 140 may all be kinematically linked with each other by the various pulleys and belts described above, rotating the upper A arm 140 through an angle X with respect to common drive pulley A 132 may cause the lower A arm 160 to rotate through an angle of −2X with respect to the upper A arm 140, and to cause the end effector A 180 to rotate through an angle of X with respect to lower A arm 160. For example, if the upper A arm 140 is rotated by 30° CW, the lower A arm 160 would rotate 60° CCW with respect to the upper A arm 140, and the end effector A 180 would rotate 30° CW with respect to the lower A arm 160, which results in a net rotation of 0° of the end effector A 180 in absolute terms. This may result in the end effector A 180 translating in a linear direction with respect to the axis of rotation of the upper A arm 140 but with no rotation of the end effector A 180 about the axis of rotation of the upper A arm 140.

The B arm 138 is constructed in a manner very similar to the manner in which the A arm 137 is constructed, although with some differences. The lower B arm 170 may include a lower B arm driven pulley 172, that, when the lower B arm 170 is rotatably connected with the upper B arm 150, may protrude into a second recess in the upper B arm 150. The lower B arm driven pulley 172 may be rigidly connected with the lower B arm 170 via a spacer 173, which may offset the lower B arm 170 from the upper B arm 150 sufficiently far enough to cause the lower B arm 170 and the lower A arm 160 to be co-planar. The diameter of the lower B arm driven pulley 172 may be one half the diameter of the common drive pulley B 133. An upper B arm drive belt 151 may be stretched over both the lower B arm driven pulley 172 and the common drive pulley B 133. The upper B arm drive belt 151 may be made from material similar to that used for the upper A arm drive belt 141. A pair of channels connecting the first recess and the second recess of the upper B arm 150 may allow the upper B arm drive belt 151 to span between the common drive pulley B 133 and the lower B arm driven pulley 172.

When the upper B arm 150 is rotated through an angle X with respect to the common drive pulley assembly 131 and, consequently, the common drive pulley B 133, this causes the upper B arm drive belt to circulate within the first recess and the second recess of the upper B arm 150, as well as within the channels connecting those recesses, and also causes the lower B arm driven pulley 172 to be rotated with respect to the upper B arm 150. Due to the 2:1 diameter ratio between the common drive pulley B 133 and the lower B arm driven pulley 172 in this example, the lower B arm driven pulley 172, as well as the lower B arm 170 rigidly connected with the lower B arm driven pulley 172, may be rotated through an angle of 2X and in the opposite direction of the rotation of the upper B arm 150 by the movement of the upper B arm drive belt 151.

The end effector B 190, as mentioned above, may be rotationally coupled with the end of the lower B arm 170 opposite the end of the lower B arm 170 featuring the lower B arm driven pulley 172. The end effector B 190 may include an end effector B driven pulley 191 that is rigidly connected with the end effector B 190, i.e., rotation of the end effector B driven pulley with respect to the lower B arm 170 causes the end effector B 190 to rotate with respect to the lower B arm 170 as well. A lower B arm drive belt 171 may be stretched over the end effector B driven pulley 191 and an upper B arm drive pulley 155. The upper B arm drive pulley 155 may be rigidly connected with the upper B arm 150, and may be approximately one half the diameter of the end effector B driven pulley 191.

When the lower B arm 170 is rotated through an angle Y with respect to the upper B arm 150, which consequently causes the upper B arm drive pulley 155 to rotate with respect to the lower B arm 170, this may cause the lower B arm drive belt 171 to circulate within the lower B arm 170 and may also cause the end effector B driven pulley 191 to be rotated with respect to the lower B arm 170 through, in this example, an angle of ½Y and in the opposite direction of the rotation of the lower B arm 170.

Because the end effector B 190, the lower B arm 170, and the upper B arm 150 may all be kinematically linked with each other by the various pulleys and belts described above, rotating the upper B arm 150 through an angle X with respect to common drive pulley B 133 may cause the lower B arm 170 to rotate through an angle of −2X with respect to the upper B arm 150, and to cause the end effector B 190 to rotate through an angle of X with respect to lower B arm 170. For example, if the upper B arm 150 is rotated by 30° CW, the lower B arm 170 would rotate 60° CCW with respect to the upper B arm 150, and the end effector B 190 would rotate 30° CW with respect to the lower B arm 170, which results in a net rotation of 0° of the end effector B 190 in absolute terms. This may result in the end effector B 190 translating in a linear direction with respect to the axis of rotation of the upper B arm 150 but with no rotation of the end effector B 190 about the axis of rotation of the upper B arm 150

Figure 1D:
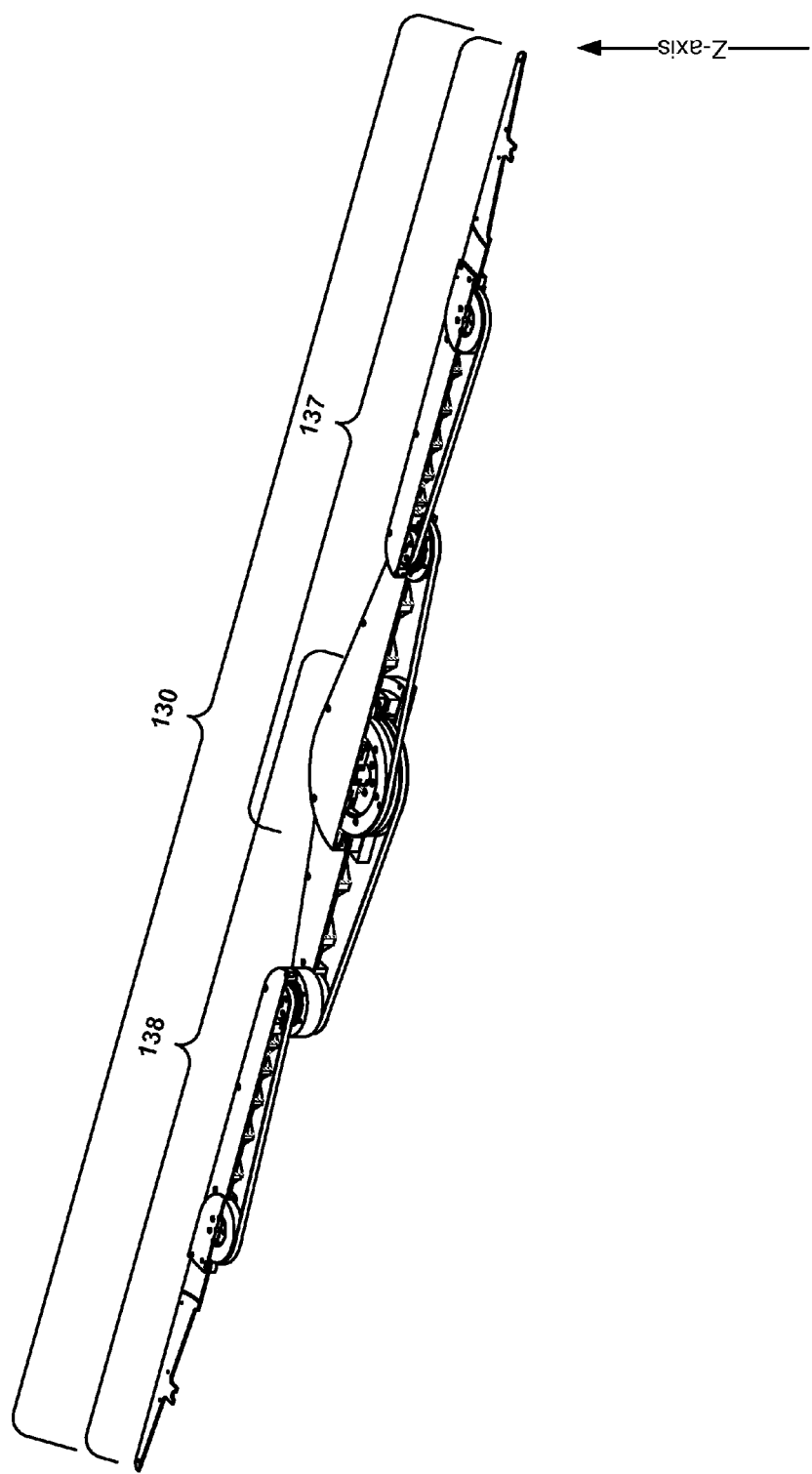
FIG. 1D shows a trimetric view of the arm assembly of FIGS. 1A-1C, but with some components shown in cut-away form and with the arms in a fully-extended position.
Figure 1E:
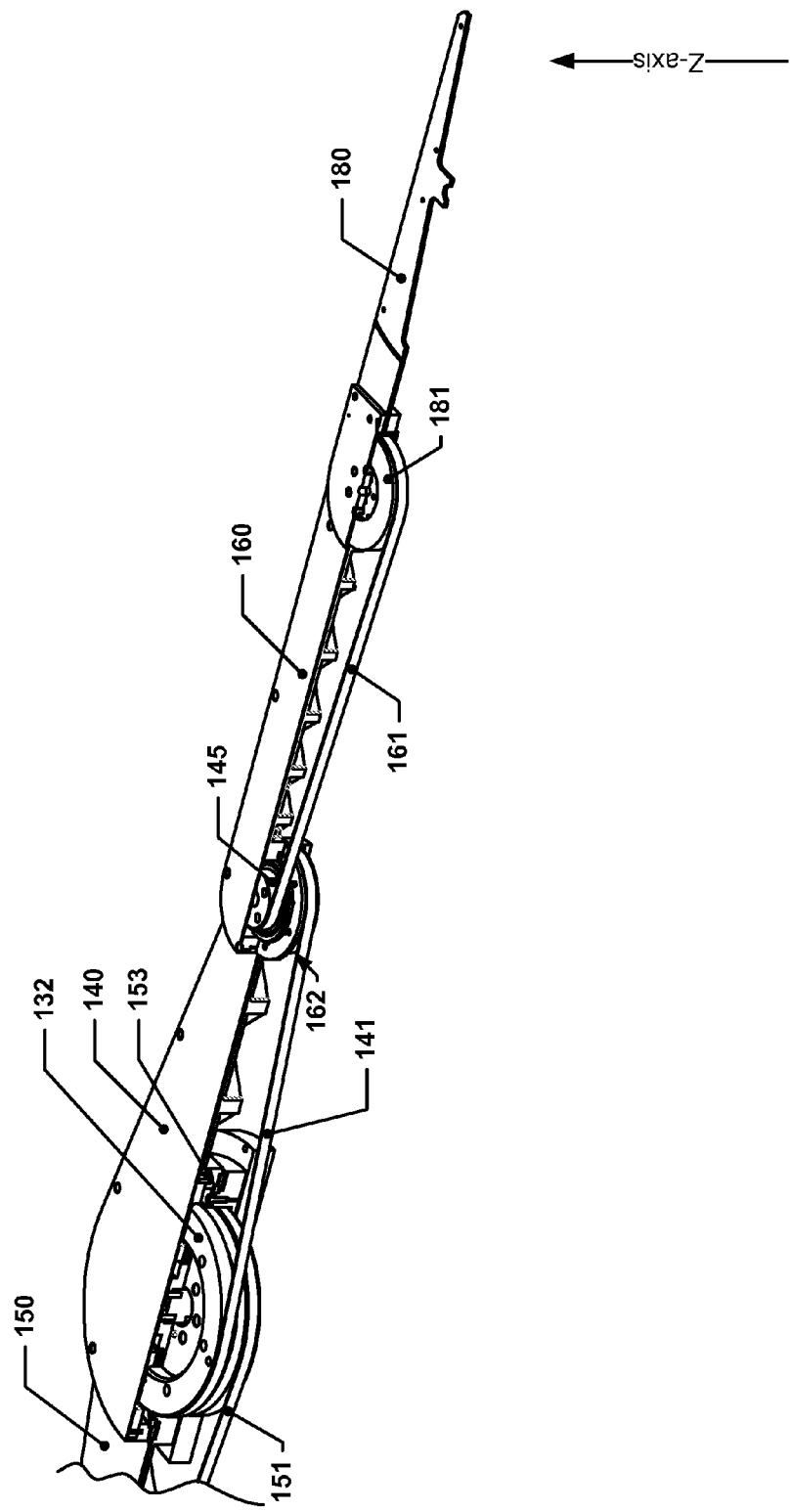
FIG. 1E shows a detail trimetric view of the A arm of the robot of FIG. 1D.
Figure 1F:
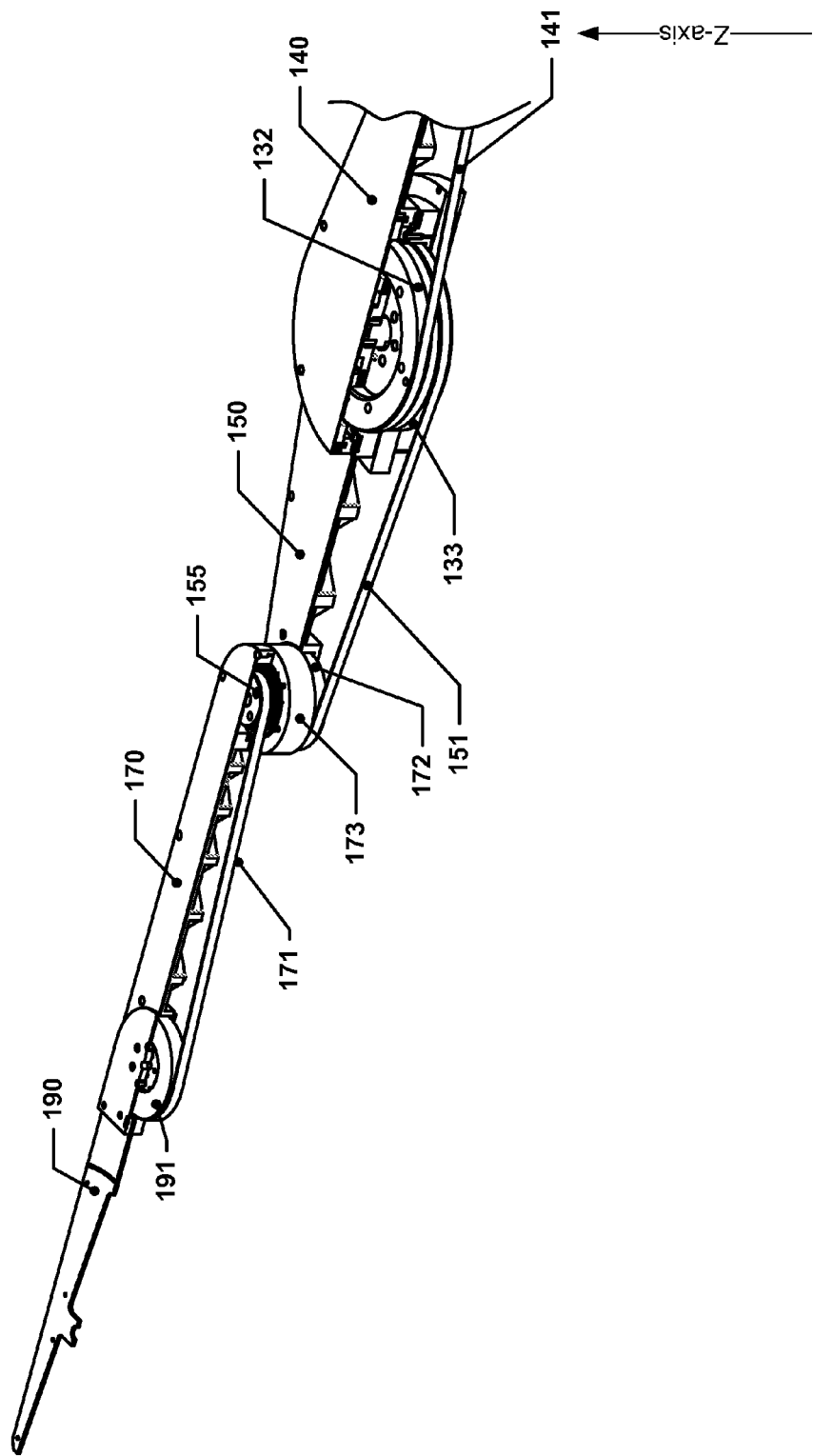
FIG. 1F shows a detail trimetric view of the B arm of the robot of FIG. 1D.

FIGS. 1D through 1F depict trimetric views of a partial cutaway of the robot 100. To allow for easier viewing, the robot 100 is shown with the arm assembly 130 at full extension, although such a configuration of the arm assembly 130 may not be possible in actual operation due to limits on belt travel within the arms or due to motion-limiting hard stops. Upper A arm 140, upper B arm 150, lower A arm 160, lower B arm 170, end effector A 180, and end effector B 190 are all shown with one half of their respective portions cut away to allow for enhanced viewing of the interior components. FIG. 1D shows the entire robot 100, FIG. 1E focuses on A arm 137, and FIG. 1F focuses on B arm 138. Various components discussed above are indicated in FIGS. 1D through 1F.

The various components of the robot 100 shown in FIGS. 1A through 1J may be made from a variety of different materials that may be selected according to various requirements. The A arm 137 and B arm 138 may, for example, be made primarily of aluminum. Various bearing surfaces within robot 100 may, for example, be made from stainless steel. Other materials may be used as needed, although materials may, in general, be selected to be largely inert with respect to process gases.

Figure 1G:
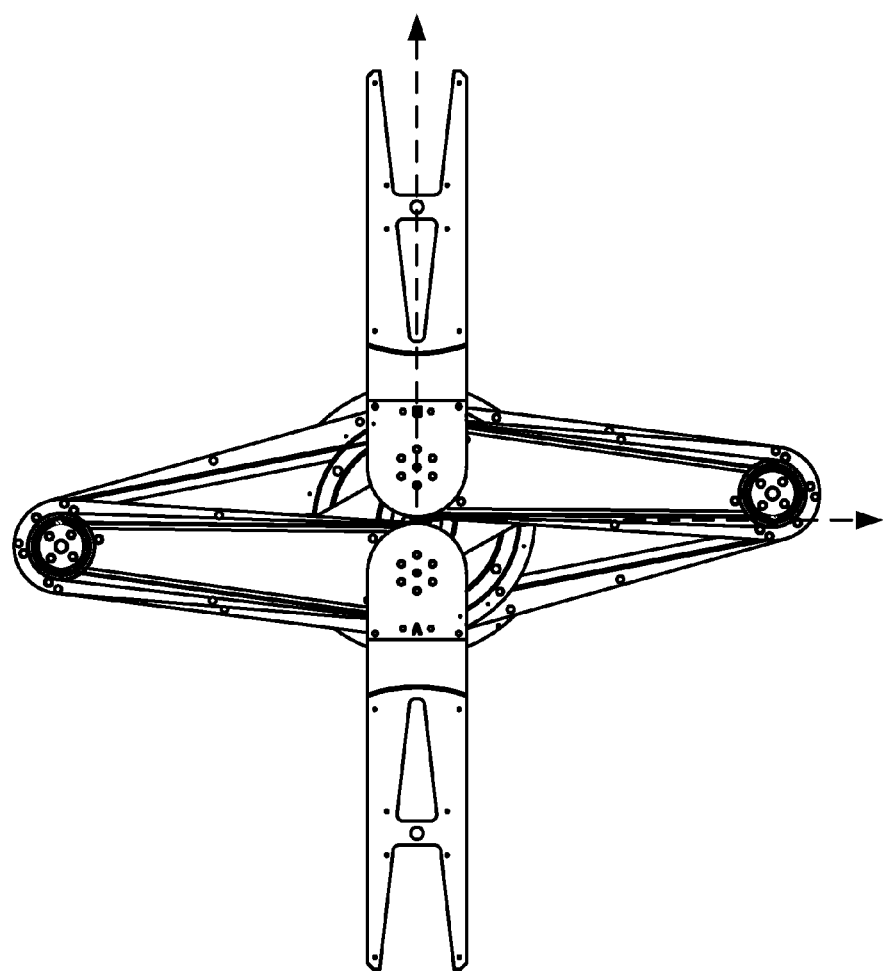
FIG. 1G shows a top view of the robot of FIG. 1A with both arms retracted.
Figure 1H:
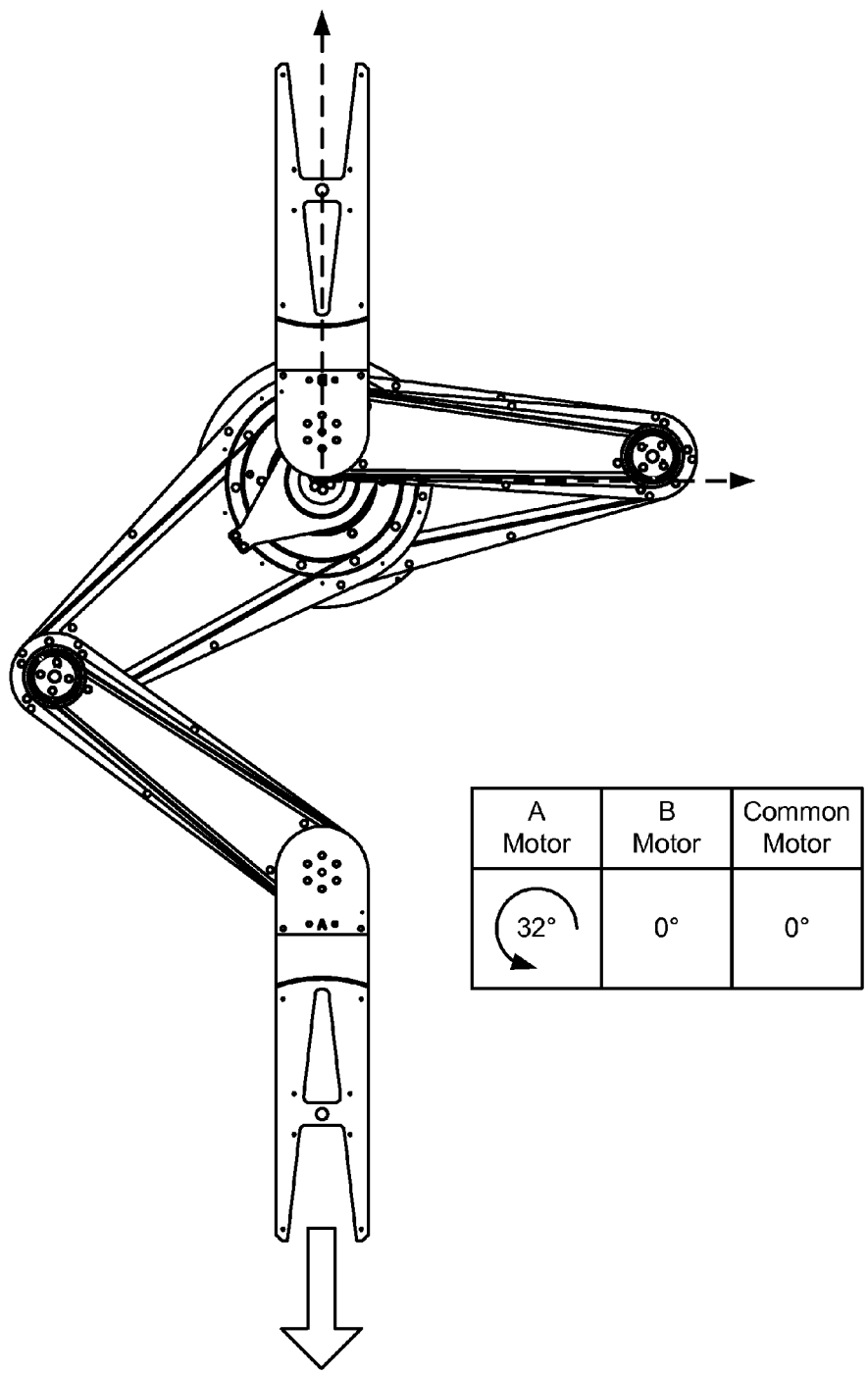
FIG. 1H shows a top view of the robot of FIG. 1G with the A arm extended.

FIG. 1G depicts a top view of the robot 100 in an "at-rest" position. FIG. 1H depicts the robot 100 with the upper A arm 140 rotated approximately 32° from the position the upper A arm is in in FIG. 1G, which causes the end effector A 180 to be extended away from the center of the robot 100. The configuration shown in FIG. 1H may be achieved by rotating the A drive motor 107 approximately 32° counter-clockwise from the position the A drive motor 107 is in, and by keeping the B drive motor 108 and the common drive motor 109 stationary, with respect to the positions those drive motors are in in FIG. 1G.

Figure 1I:
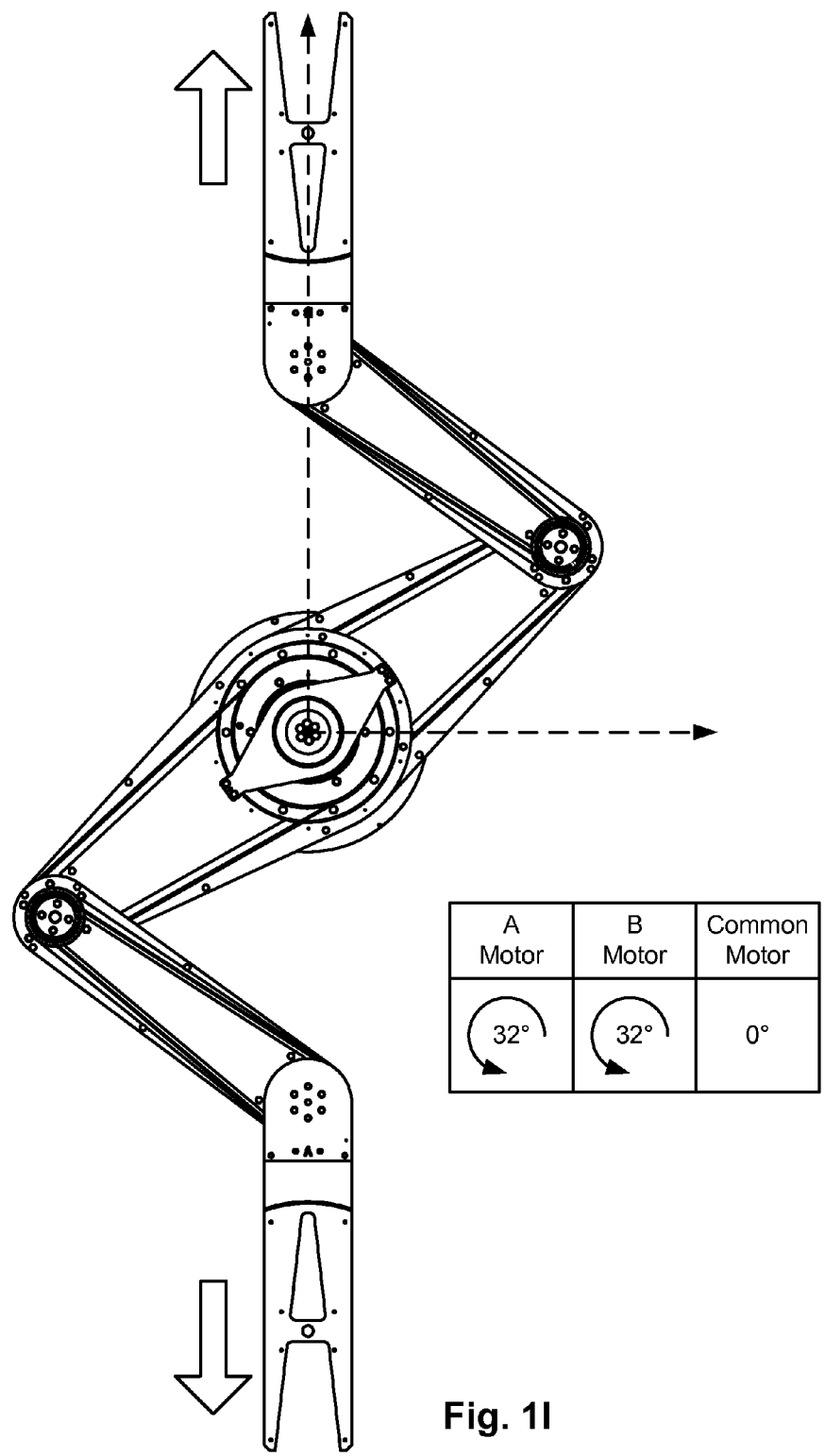
FIG. 1I shows a top view of the robot of FIG. 1G with the A arm and the B arm extended.

FIG. 1I depicts a top view of the robot 100 with both upper A arm 140 and upper B arm 150 rotated approximately 32° counter-clockwise from the position each arm is in in FIG. 1G, which causes the end effector A 180 and the end effector B 190 to extend away from the center of the arm assembly 130. While the A drive motor 107 and the B drive motor 108 may both be rotated by 32° with respect to the positions those motors are in in FIG. 1G, the common drive motor 109 may remain stationary with respect to the position it is in FIG. 1G.

While the above discussion has focused on rotational movement of the upper arms which causes the end effectors to translate in a direction perpendicular to the axis of rotation of the upper arms, the upper arms may also be rotated to cause the end effectors to rotate about the upper arm rotational axes without translation, i.e., the entire arm assembly 130 may be rotated about the rotational axes of the upper arms without any movement of the arms with respect to each other.

Such rotational movement of the arm assembly may be achieved by rotating the upper A arm 140, the upper B arm 150, and the common drive pulley assembly 131 in the same direction and at the same angular rate. Since the rotational movements of the lower A arm 160 with respect to the upper A arm 140 and the end effector A 180 with respect to the lower A arm 160 are both driven by relative rotational movement of the upper A arm 140 with respect to the common drive pulley A 132, rotating the common drive pulley assembly 131 at the same rotational rate as the upper A arm 140 results in the lower A arm 160 staying fixed with respect to the upper A arm 140 and the end effector A 180 staying fixed with respect to the lower A arm 160 while the entire A arm 137 rotates. Similar behavior may be observed in the B arm 138. Thus, the robot 100 may be used to perform "pick" and "place" operations, in which the end effectors are extended and retracted, in combination with vertical displacement of the arm assembly 130, in order to pick up or place wafers in wafer processing chambers or other locations. The robot 100 may also be rotated to allow the end effectors to be extended into and retracted from different processing chambers.

Figure 1J:
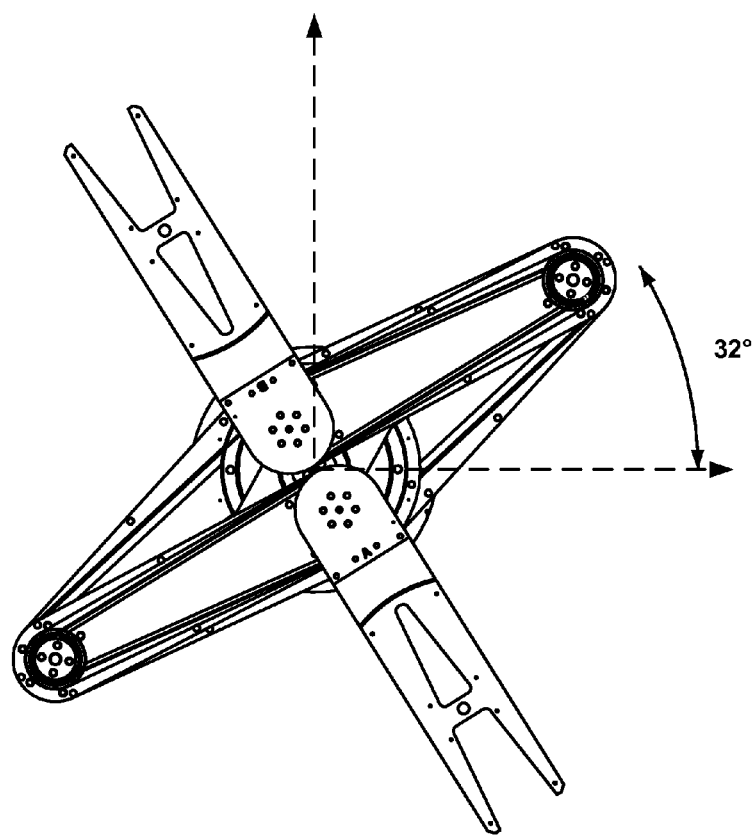
FIG. 1J shows a top view of the robot of FIG. 1G with the A arm and the B arm retracted and the entire arm assembly rotated.

FIG. 1J depicts a top view of the robot 100 showing such rotational movement. In FIG. 1J, the A drive motor 107, the B drive motor 108, and the common drive motor 109 are all rotated by approximately 32° with respect to the positions of those motors in FIG. 1G. This results in the entire arm assembly 130 rotating about the centers of rotation of the upper A arm 140 and the upper B arm 150 without any translation of the end effectors away from these rotational axes.

The A arm 137 and the B arm 138 may each be actuated independently of each other, i.e., the A arm 137 and the B arm 138 are not kinematically linked with each other during end effector linear/radial translation. In a robot such as the robot 100, the end effectors may be paddle or spatula type effectors that lift a wafer from underneath and may rely on friction to hold the wafer in place while the end effector is in motion. Some implementations may utilize other types of end effectors, such as vacuum-assisted friction devices. In end effectors that utilize friction, however, the maximum acceleration with which the end effector may be moved when carrying a wafer may be friction-limited, i.e., accelerating the rate of effector movement beyond a certain limit may cause the wafer that the end effector is carrying to slip because the acceleration is sufficient to overcome the friction force. When movement of an end effector does not cause movement of a wafer, there is no risk of wafer slippage due to the movement of the end effector and the maximum acceleration of the end effector may instead be torque-limited instead of friction-limited. However, in designs where end effectors are kinematically linked, e.g., translation of one end effector causes some translation of the other end effector, the maximum acceleration of an end effector may still be friction-limited even when that end effector is not carrying a wafer if the other end effector is carrying a wafer. At the least, a wafer that shifts during effector movement may not be in the optimum location when placed in the destination process chamber, and valuable process time may be lost correcting for the misplacement. In some cases, slippage may result in the wafer falling off of the effector and may cause damage to, or destruction of, the wafer in addition to lost process time.

Because the A arm 137 and the B arm 138 are not kinematically linked during end effector linear translation, each end effector is only friction limited when actually carrying a wafer during end effector linear translation. This allows a robot such as the robot 100 to operate at higher throughput rates. For example, consider a wafer transfer operation in which the A arm 137 is used to pick up a wafer using a "pick" motion while the B arm 138 is used to hold a different wafer using the end effector B 190. A pick motion may include extending the end effector A 180 away from the base 101 of the robot 100 (a linear translation of the end effector A 180 underneath the wafer), a z-axis translation of the arm assembly 130 upwards (lifting the wafer clear of the wafer support), and a retraction of the end effector A 180 (a linear translation of the end effector A to withdraw the wafer from the process chamber). In a robot with kinematically-linked arms, the time for each of these stages is estimated to be 0.9 seconds for extension, 0.7 seconds for z-axis translation upwards, and 1.4 seconds for retraction. By contrast, the estimated time for each stage using a robot such as the robot 100 is 0.6 seconds for extension, 0.7 seconds for z-axis translation upwards, and 1.4 seconds for retraction. As can be seen, the last two stages for either robot have similar times because in the last two stages, both arms of the robot are carrying wafers. However, the first stage is noticeably quicker for the robot 100 since the A arm 137 may be moved at a higher rate of speed since it is not kinematically linked to the wafer-holding B arm 138 during the extension of the end effector A 180.

Similarly, a "place" motion, in which wafers may be placed into a destination chamber, may see a similar speed increase using a robot such as the robot 100. A place motion may include similar stages to those used in a pick motion, but with downwards z-axis movement instead of upwards z-axis movement. In a robot with kinematically-linked arms, the time for each of these stages is estimated to be 1.4 seconds for extension, 0.7 seconds for z-axis translation downwards, and 0.9 seconds for retraction. By contrast, the estimated time for each stage using a robot such as the robot 100 is 1.4 seconds for extension, 0.7 seconds for z-axis translation downwards, and 0.6 seconds for retraction.

In between the pick and place motions, the robot 100 may rotate the arm assembly 130, for example, by 180° in order to transfer a picked wafer from one processing chamber to another processing chamber. While a rotation of greater than 180° may be performed, the same end positioning may often be achieved by rotating a lesser amount in the opposite direction, thus, 180° represents a reasonable maximum rotation angle through which the arm assembly 130 may be rotated in many implementations. The robot 100 and a robot with kinematically-linked arms may both take approximately 2.4 seconds to rotate 180°.

Thus, according to the estimates provided above, a robot with kinematically-linked arms may require 8.4 seconds to perform a single pick, rotation, and place cycle, whereas the robot 100 may only require 7.8 seconds to perform the same actions. Each wafer must at least be picked from a loadlock and placed into a chamber, and then picked from the chamber and placed into a loadlock, a minimum of two such complete pick-and-place cycles must be performed for each wafer—if additional process chambers are involved, the number of pick-and-place cycles per wafer may increase beyond this.

This represents approximately an 8% improvement in cycle time for the robot 100 over a robot with kinematically-linked arms.

Figure 2B:
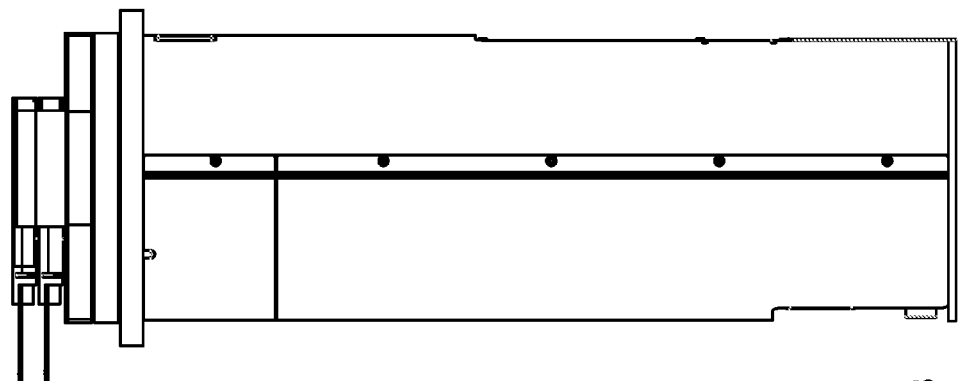
FIG. 2B shows a side view of the robot of FIG. 2A.
Figure 2A:
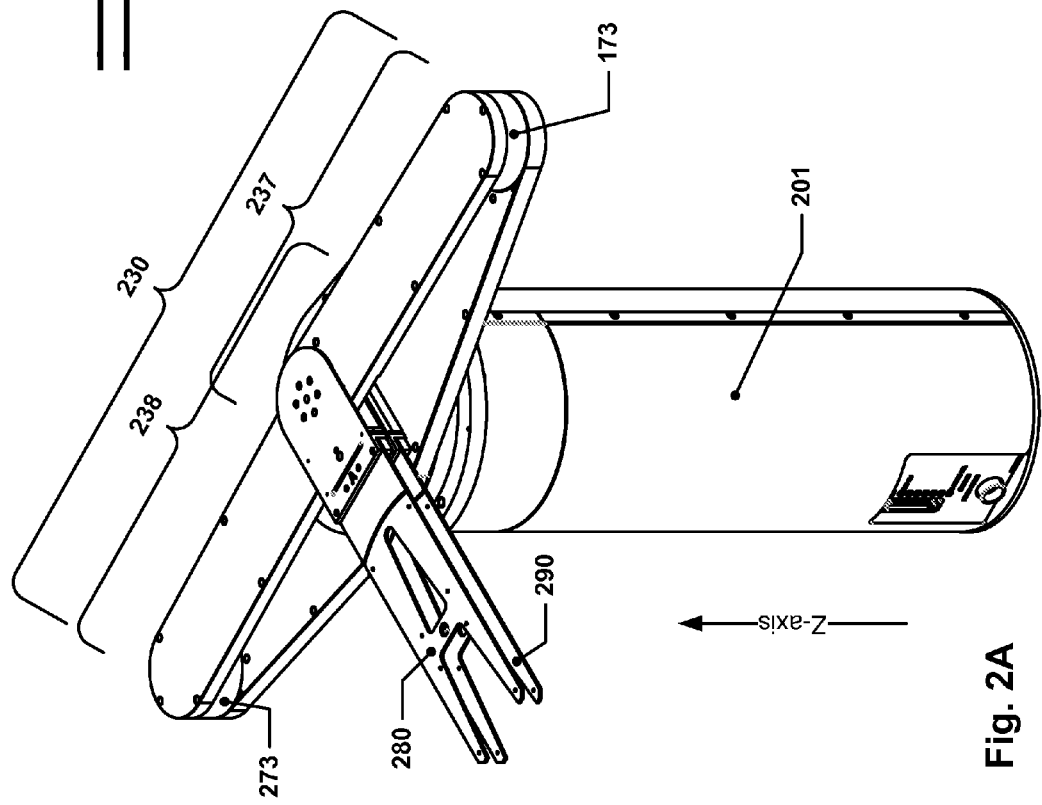
FIG. 2A shows an isometric view of another implementation of a robot according to the present disclosure.

As mentioned previously, other implementations may feature an arm assembly with end effectors facing the same direction. FIG. 2A shows an isometric view of robot 200, which features an arm assembly 230 that is mounted to a base unit 201. The arm assembly 230 has an end effector A 280 and an end effector B 290 facing the same direction. FIG. 2B depicts a side view of the robot 200, and illustrates how the two end effectors are positioned in similar locations yet offset from one another.

In principle, the robot 200 may be constructed and operate in a very similar manner to the robot 100 discussed above. However, while largely similar in operation and construction, some differences may be observed. For example, whereas the drive motor A 107 and the drive motor B 108 may each be rotated in the same direction to translate the end effector A 180 and the end effector B 190, respectively, in the same radial direction in the robot 100, corresponding drive motors for each arm in the robot 200 may be rotated in opposite directions to cause the end effector A 280 and the end effector B 290 to translate in the same radial direction. To rotate the arm assembly 230 without translation of the end effector A 280 and the end effector B 290 away from the center of rotation, all three drive motors may be driven in the same direction.

Figure 2C:
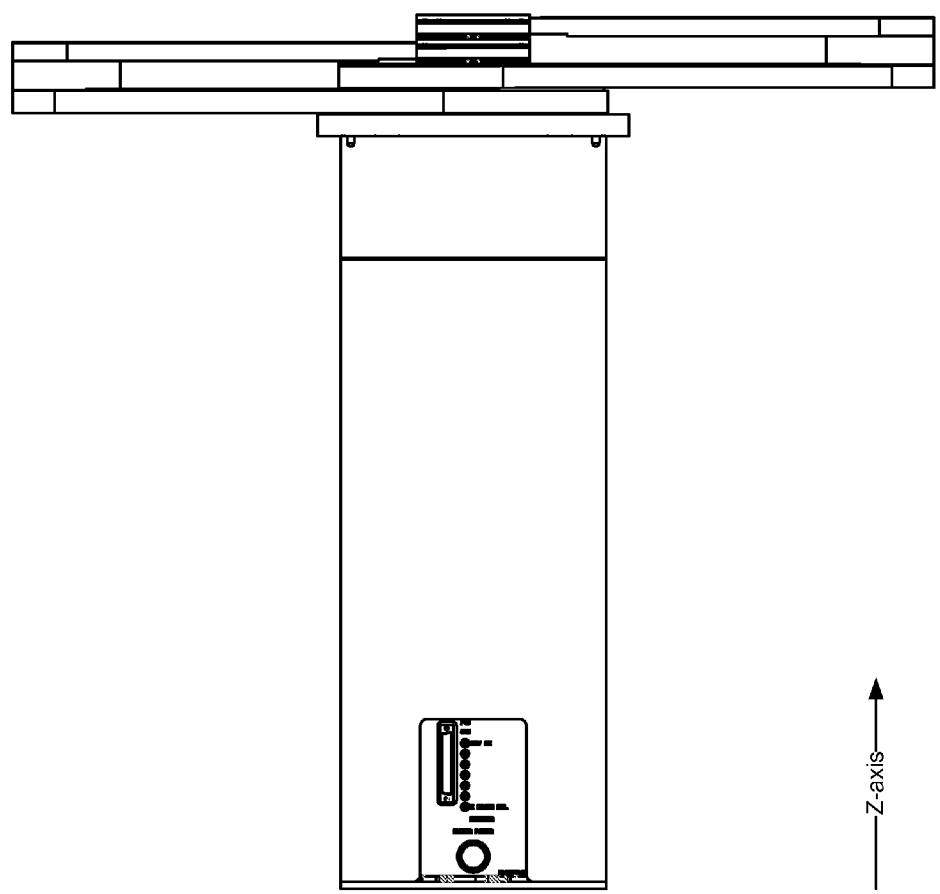
FIG. 2C shows a front view of the robot of FIG. 2A.
Figure 2D:
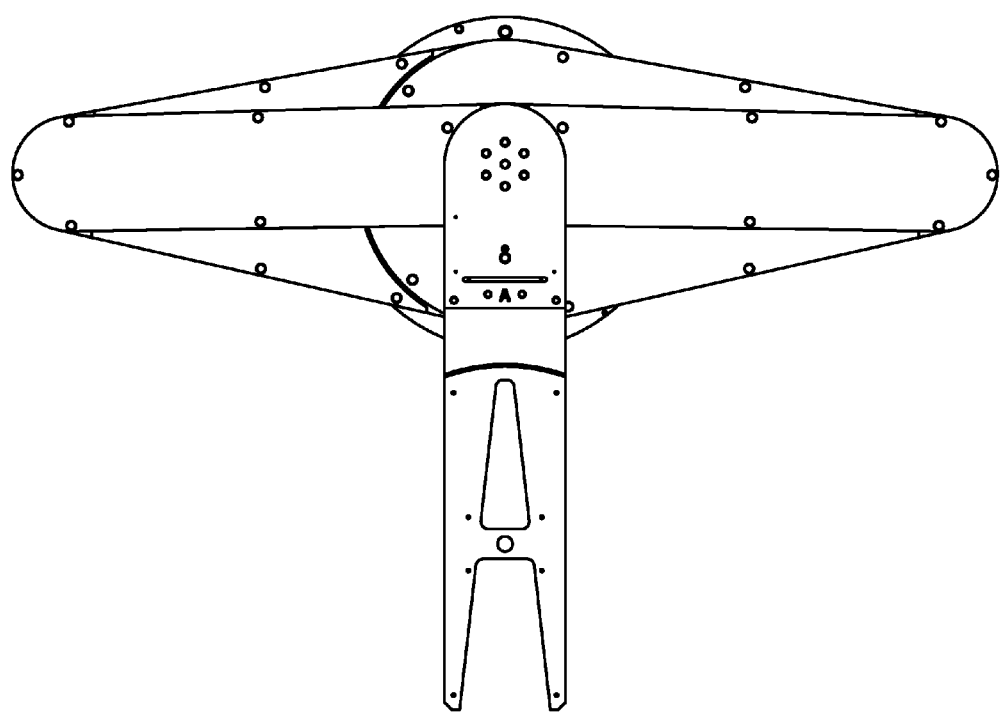
FIG. 2D shows a top view of the robot of FIG. 2A.

Another difference between the robot 200 and the robot 100 is that both the A arm 237 and the B arm 238 may feature spacers 273 which are similar to spacer 173 for B arm 138 in the robot 100. This extra spacer allows the A arm 237 and the B arm 238 to interleave with each other, as is evident in FIG. 2C. FIG. 2D shows a top view of the robot 200. Due to the end effectors both being in the same rest position but offset from each other, only the end effector A 280, and not the end effector B 290, is visible.

While the various internal mechanisms of robot 200 are not shown in the figures; they may be largely similar to the internal mechanisms of the robot 100.

Figure 3:
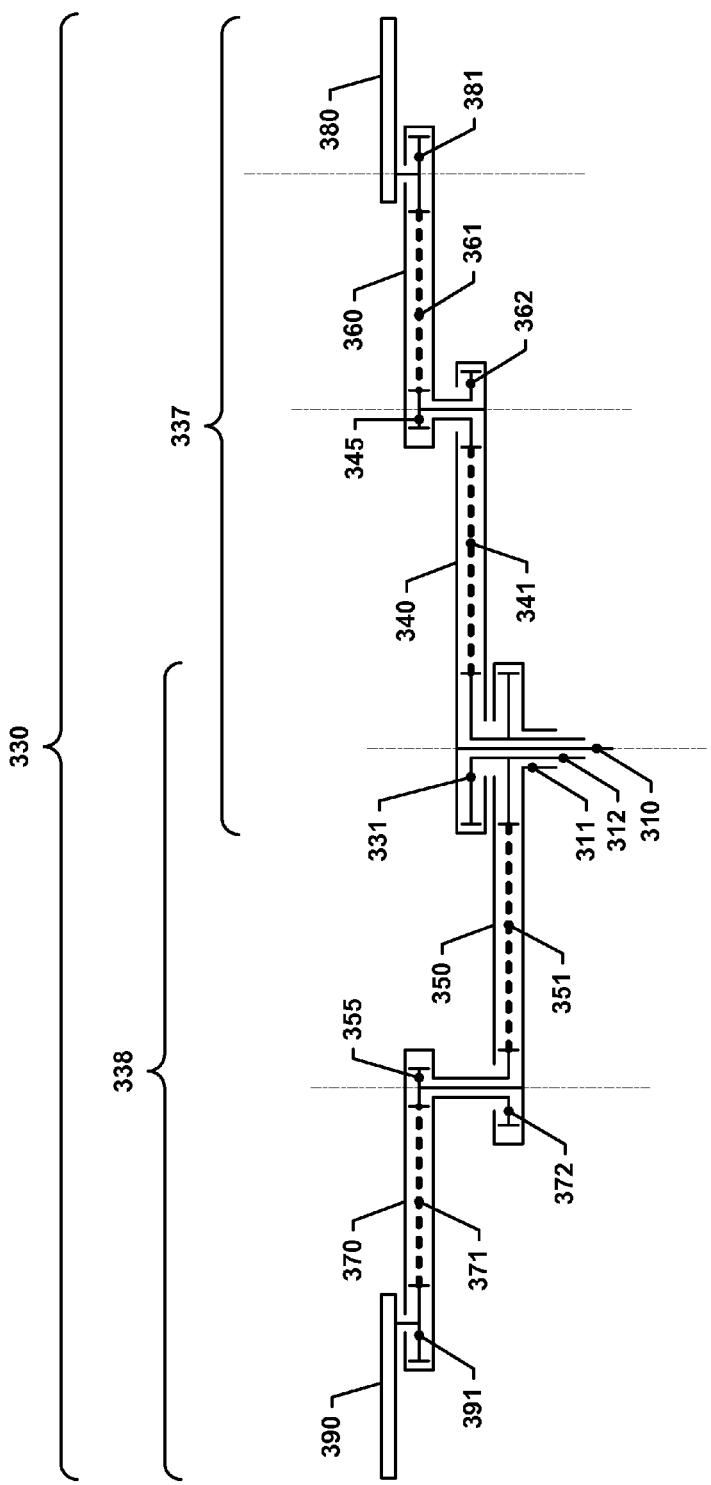
FIG. 3 shows a schematic of a dual-arm vacuum robot according to the present disclosure.

FIG. 3 shows a schematic of a dual-arm vacuum robot according to the present disclosure. Visible in FIG. 3 is an arm assembly 330 that includes an A arm 337 and a B arm 338. The A arm 337 includes an upper A arm 340, a lower A arm 360, and an end effector A 380. The B arm 338 includes an upper B arm 350, a lower B arm 370, and an end effector B 390. The upper A arm 340 is rigidly connected with an A drive shaft 310 and the upper B arm 350 is rigidly connected with a B drive shaft 311. A common drive shaft 312 may be coaxially interposed between the A drive shaft 310 and the B drive shaft 311 and may be rigidly connected with a common drive pulley assembly 331. Thus, the upper A arm 340 may be rotated by rotating the A drive shaft 310, the upper B arm 350 may be rotated by rotating the B drive shaft 311, and the common drive pulley assembly 331 may be rotated by rotating the common drive shaft 312.

The upper A arm 340 and the upper B arm 350 may both be configured to rotate about a substantially common axis; the ends of the A arm 340 and the B arm 350 that rotate about the substantially common axis may be referred to as proximal ends of the A arm 340 and the B arm 350, whereas the opposing ends of the A arm 340 and the B arm 350 may be referred to as distal ends of the A arm 340 and the B arm 350.

The upper A arm 340 may be rotatably connected with the lower A arm 360 at the distal end of the upper A arm 340. A lower A arm driven pulley 362 that is rigidly connected with the lower A arm 360 may protrude into the upper A arm 340, and an upper A arm drive pulley 345 that is rigidly connected with the upper A arm 340 may protrude into the lower A arm 360. An upper A arm drive belt 341 may rotatably connect the lower A arm driven pulley 362 with the common drive pulley assembly 331 such that relative rotation between the common drive pulley assembly 331 and the upper A arm 340 causes the lower A arm driven pulley 362, as well as the lower A arm 360, to rotate relative to the upper A arm 340. Similarly, the lower A arm 360 may be rotatably connected with the end effector A 380. An end effector A driven pulley 381 may be rigidly connected with the end effector A 380 and may protrude into the lower A arm 360. A lower A arm drive belt 361 may rotatably connect the upper A arm drive pulley 345 with the end effector A driven pulley 381 such that relative rotation between the upper A arm drive pulley 345 and the lower A arm 360 causes the end effector A driven pulley 381, as well as the end effector A 380, to rotate relative to the lower A arm 360.

The portion of the lower A arm 360 that is rotatably connected with the distal end of the upper A arm 340 may be referred to as the proximal end of the lower A arm 360, and the opposing end of the lower A arm 360, i.e., the end that is rotatably connected with the end effector A 380, may be referred to as the distal end of the lower A arm 360.

In a similar fashion, the upper B arm 350 may be rotatably connected with the lower B arm 370 at the distal end of the lower arm 370. A lower B arm driven pulley 372 that is rigidly connected with the lower B arm 370 may protrude into the upper B arm 350, and an upper B arm drive pulley 355 that is rigidly connected with the upper B arm 350 may protrude into the lower B arm 370. An upper B arm drive belt 351 may rotatably connect the lower B arm driven pulley 372 with the common drive pulley assembly 331 such that relative rotation between the common drive pulley assembly 331 and the upper B arm 350 causes the lower B arm driven pulley 372, as well as the lower B arm 370, to rotate relative to the upper B arm 350. Similarly, the lower B arm 370 may be rotatably connected with the end effector B 390. An end effector B driven pulley 391 may be rigidly connected with the end effector B 390 and may protrude into the lower B arm 370. A lower B arm drive belt 371 may rotatably connect the upper B arm drive pulley 355 with the end effector B driven pulley 391 such that relative rotation between the upper B arm drive pulley 355 and the lower B arm 370 causes the end effector B driven pulley 391, as well as the end effector B 390, to rotate relative to the lower B arm 370.

Similarly, the portion of the lower B arm 370 that is rotatably connected with the distal end of the upper B arm 350 may be referred to as the proximal end of the lower B arm 370, and the opposing end of the lower B arm 370, i.e., the end that is rotatably connected with the end effector B 390, may be referred to as the distal end of the lower B arm 370.

Thus, rotating the A drive shaft 310 without rotating the common drive shaft 312 or the B drive shaft 311 may cause the A arm 337 to extend or retract without extending or retracting the B arm 338 and without rotating either the A arm 337 or the B arm 338. Similarly, rotating the B drive shaft 311 without rotating the common drive shaft 312 or the A drive shaft 310 may cause the B arm 338 to extend or retract without extending or retracting the A arm 337 and without rotating either the A arm 337 or the B arm 338. Rotating the A drive shaft 310, the B drive shaft 311, and the common drive shaft 312 may cause the A arm 337 and the B arm 338 to rotate about the center of the arm assembly 330 without extending or retracting.

The ratio of the common drive pulley assembly 331 diameter to either the lower A arm driven pulley 362 diameter or the lower B arm driven pulley 372 diameter may be 2:1; this may cause twice as much relative rotation between the lower A arm driven pulley 362 and the upper A arm 340 as between the common drive pulley assembly 331 and the upper A arm 340. Similarly, the ratio of the end effector A driven pulley 381 diameter or the end effector B driven pulley 391 diameter to the upper A arm drive pulley 345 or the upper B arm drive pulley 355, respectively, may be 2:1; this may, for example, cause half as much relative rotation between the end effector A 380 and the lower A arm 360 as between the upper A arm drive pulley 345 and the lower A arm 360.

Such arrangements allow for independent retraction and extension of either robot arm, as well as rotation of the robot arms together, with a lower number of motors as compared to two-arm systems that allow for both arms to extend, retract, and rotate with complete independence. Coupling rotational movement of the robot arms also allows for a simpler control scheme, since it is unnecessary to monitor the positions of the arms with respect to each other to prevent rotational interference with one another.

It is to be understood that the robots described above may also include other or additional components, e.g., motor controllers, sensors, anti-vibration mounts, etc. For example, a robot such as those described herein may be implemented within a central transfer chamber or hub that may be configured to interface with various loadlocks and process chambers. The central transfer chamber or hub may be configured to be environmentally controlled, e.g., sealed from the ambient environment and temperature- and pressure-controlled, and filled with a desired atmospheric gas mixture. Such an implementation, or other implementations, may also include a system controller having instructions for controlling the robot during process operations in accordance with the present invention. For example, the controller may be configured to translate a command to extend an end effector A into signals that activate drive motor A without activating drive motor B or the common drive motor. Similarly, the controller may be configured to translate a command to rotate the A arm and the B arm into drive signals that activate the A drive motor, the B drive motor, and the common drive motor in the same direction. The controller may be configured to translate other commands to the robot arm in a manner consistent with the above disclosure. The system controller will typically include one or more memory devices and one or more processors configured to execute the instructions so that the apparatus will perform a method in accordance with the present invention. Machine-readable media containing instructions for controlling process operations in accordance with the present invention may be coupled to the system controller.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper. A robot such as that described herein may be used to move a substrate from one tool to another, thus facilitating fabrication processes.

It will also be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the invention.

What is claimed is:

1. A wafer-transport robot for use in semiconductor fabrication apparatus vacuum chambers, the robot comprising:
 a common drive pulley;
 a first arm, the first arm including:
  a first end effector interface,
  a first upper arm with a proximal end and a distal end opposite the proximal end of the first upper arm,
  a first lower arm with a proximal end and a distal end opposite the proximal end of the first lower arm,
  a first lower arm driven pulley fixedly connected with the proximal end of the first lower arm, and
  a first upper arm drive belt rotationally coupling the first lower arm driven pulley with the common drive pulley;
 a second arm, the second arm including:
  a second end effector interface,
  a second upper arm with a proximal end and a distal end opposite the proximal end of the second upper arm,
  a second lower arm with a proximal end and a distal end opposite the proximal end of the second lower arm,
  a second lower arm driven pulley fixedly connected with the proximal end of the second lower arm, and
  a second upper arm drive belt rotationally coupling the second lower arm driven pulley with the common drive pulley;
 a base, the base including:
  a first motor;
  a second motor; and
  a third motor, wherein:
   the base has a central axis,
   activation of the first motor without activation of the second motor or the third motor causes the first arm to translate the first end effector interface in a direction perpendicular to the central axis without rotation of the first end effector interface about the central axis,
   activation of the second motor without activation of the first motor or the third motor causes the second arm to translate the second end effector interface in a direction perpendicular to the central axis without rotation of the second end effector interface about the central axis,
   activation of the first motor, the second motor, and the third motor simultaneously causes the first end effector interface and the second end effector interface to rotate about the central axis without translation of the first end effector interface and the second end effector interface in directions perpendicular to the central axis, the proximal ends of the first upper arm and the second upper arm are both configured to rotate about the central axis, the proximal end of the first lower arm is rotatably connected with the distal end of the first upper arm, the proximal end of the second lower arm is rotatably connected with the distal end of the second upper arm, the first end effector interface is rotatably connected with the distal end of the first lower arm, the second end effector interface is rotatably connected with the distal end of the second lower arm, and the common drive pulley has a common drive pulley diameter, the first lower arm driven pulley and the second lower arm driven pulley both have a lower arm driven pulley diameter, and the common drive pulley diameter and the lower arm driven pulley diameter have a ratio to one another of 2:1, respectively.

2. The robot of claim 1, wherein:
activation of the first motor without activation of the second motor or the third motor does not cause the second arm to move, and
activation of the second motor without activation of the first motor or the third motor does not cause the first arm to move.

3. The robot of claim 1, wherein:
the first arm includes a first mechanical input including a first primary rotational input and the common pulley, wherein:
the first primary rotational input and the common pulley are both configured to rotate about the central axis,
rotation of the first primary rotational input relative to the common pulley in a first rotational direction causes the first end effector interface to translate in a first direction perpendicular to the central axis, and
rotation of the first primary rotational input and the common pulley both in the same rotational direction causes the first end effector interface to rotate about the central axis without translating in a direction perpendicular to the central axis,
the second arm includes a second mechanical input including a second primary rotational input and the common pulley, wherein:
the second primary rotational input and the common pulley are both configured to rotate about the central axis,
rotation of the second primary rotational input relative to the common pulley in a second rotational direction causes the second end effector interface to translate in a second direction perpendicular to the central axis, and
rotation of the second primary rotational input and the common pulley both in the same rotational direction causes the second end effector interface to rotate about the central axis without translating in a direction perpendicular to the central axis.

4. The robot of claim 3, wherein:
the first primary rotational input is rotationally coupled with the first motor,
the second primary rotational input is rotationally coupled with the second motor, and
the common pulley is rotationally coupled with the third motor.

5. The robot of claim 1, wherein the first motor, the second motor, and the third motor each have an axis of rotation and the axes of rotation of the first motor, the second motor, and the third motor are coaxial with the central axis.

6. The robot of claim 1, wherein the base further includes a fourth motor, the fourth motor configured to translate the first arm and the second arm in a direction parallel to the central axis.

7. The robot of claim 1, further comprising:
a first upper arm drive pulley fixedly connected with the first upper arm;
a second upper arm drive pulley fixedly connected with the second upper arm;
a first end effector driven pulley fixedly connected with the first end effector interface;
a second end effector driven pulley fixedly connected with the second end effector interface;
a first lower arm drive belt rotationally coupling the first end effector driven pulley with the first upper arm drive pulley; and
a second lower arm drive belt rotationally coupling the second end effector driven pulley with the second upper arm drive pulley.

8. The robot of claim 7, wherein the first upper arm drive pulley and the second upper arm drive pulley both have an upper arm drive pulley diameter, the first end effector driven pulley and the second end effector driven pulley both have an end effector driven pulley diameter, and the upper arm drive pulley diameter and the end effector driven pulley diameter have a ratio to one another of 1:2, respectively.

9. The robot of claim 1, wherein the first motor, the second motor, and the third motor each have an axis of rotation and at least one of the axes of rotation of the first motor, the second motor, and the third motor is offset from the central axis.

10. The robot of claim 1, further comprising:
a controller including one or more processors and one or more memories and configured to control the first motor, the second motor, and the third motor, the one or more memories storing computer-executable instructions for controlling the one or more processors to:
activate the first motor without activating the second motor or the third motor to cause the first arm to extend the first end effector interface in a first radial direction perpendicular to the central axis without causing rotation of the first end effector interface about the central axis,
activate the second motor without activating the first motor or the third motor to cause the second arm to extend the second end effector interface in a second radial direction perpendicular to the central axis without causing rotation of the second end effector interface about the central axis, and
activate the first motor, the second motor, and the third motor simultaneously to cause the first end effector interface and the second end effector interface to rotate about the central axis without causing translation of the first end effector interface and the second end effector interface in directions perpendicular to the central axis.

11. The robot of claim 10, wherein:
the first end effector interface and the second end effector interface are oriented in opposing directions, and
the computer executable instructions for controlling the one or more processors include instructions for controlling the one or more processors to:
activate the first motor without activating the second motor or the third motor by causing the first motor to provide a rotational output in a first rotational direction about a first axis parallel to the central axis, activate the second motor without activating the first motor or the third motor by causing the second motor to provide a rotational output in the first rotational direction about a second axis parallel to the central axis, and activate the first motor, the second motor, and the third motor by causing the first motor, the second motor and the third motor to rotate in the same rotational direction simultaneously to cause the first end effector interface and the second end effector interface to rotate about the central axis without causing translation of the first end effector interface and the second end effector interface in directions perpendicular to the central axis.

12. The robot of claim 11, wherein:
the first end effector interface and the second end effector interface are substantially co-planar with one another.

13. The robot of claim 10, wherein:
the first end effector interface and the second end effector interface are oriented in the same direction, and
the computer executable instructions for controlling the one or more processors include instructions for controlling the one or more processors to:
activate the first motor without activating the second motor or the third motor to extend the first arm by causing the first motor to provide a rotational output in a first rotational direction about a first axis parallel to the central axis, activate the second motor without activating the first motor or the third motor to extend the second arm by causing the second motor to provide a rotational output in a second rotational direction about a second axis parallel to the central axis, the second rotational direction opposite the first rotational direction, and activate the first motor, the second motor, and the third motor by causing the first motor, the second motor and the third motor to rotate in the same rotational direction simultaneously to cause the first end effector interface and the second end effector interface to rotate about the central axis without causing translation of the first end effector interface and the second end effector interface in directions perpendicular to the central axis.

14. The robot of claim 13, wherein:
the first end effector interface and the second end effector interface are located on spaced-apart parallel planes and are configured to have substantially the same range of radial motion.

15. The robot of claim 1, further comprising:
a first end effector; and
a second end effector, wherein:
the first end effector is affixed to the first end effector interface, and
the second end effector is affixed to the second end effector interface.

\* \* \* \* \*

UNITED STATES PATENT AND TRADEMARK OFFICE
CERTIFICATE OF CORRECTION

| | | |
|---|---|---|
| PATENT NO. | : 8,961,099 B2 | Page 1 of 1 |
| APPLICATION NO. | : 13/739744 | |
| DATED | : February 24, 2015 | |
| INVENTOR(S) | : Richard M. Blank et al. | |

It is certified that error appears in the above-identified patent and that said Letters Patent is hereby corrected as shown below:

In the Claims

Column 16, line 43, "drive pulley;" should be changed to "drive pulley; and"
Column 17, line 42, "the central axis," should be changed to "the central axis, and"

Signed and Sealed this
Twenty-second Day of March, 2016

Michelle K. Lee
*Director of the United States Patent and Trademark Office*